US012720689B2

(12) United States Patent
Endo

(10) Patent No.: US 12,720,689 B2
(45) Date of Patent: Aug. 25, 2026

(54) HOUSING APPARATUS OF ELECTRICAL COMPONENTS

(71) Applicant: MAHLE International GmbH, Stuttgart (DE)

(72) Inventor: Hiroshi Endo, Shizuoka (JP)

(73) Assignee: Mahle International GmbH (DE)

(*) Notice: Subject to any disclaimer, the term of this patent is extended or adjusted under 35 U.S.C. 154(b) by 221 days.

(21) Appl. No.: 18/607,414

(22) Filed: Mar. 15, 2024

(65) Prior Publication Data

US 2024/0365483 A1 Oct. 31, 2024

(30) Foreign Application Priority Data

Mar. 17, 2023 (JP) ................................. 2023-043394

(51) Int. Cl.

*H05K 5/02* (2006.01)
*H05K 5/03* (2006.01)
*H05K 7/20* (2006.01)
*B60R 16/023* (2006.01)

(52) U.S. Cl.

CPC ............. *H05K 5/0217* (2013.01); *H05K 5/03* (2013.01); *H05K 7/2039* (2013.01); *B60R 16/0239* (2013.01)

(58) Field of Classification Search

CPC ...... H05K 5/0214; H05K 5/0217; H05K 5/03; H05K 5/061; H05K 7/2039; B60R 16/0239; H02K 5/10

See application file for complete search history.

(56) References Cited

U.S. PATENT DOCUMENTS

| | | | | |
|---|---|---|---|---|
| 6,092,812 | A * | 7/2000 | Ursel | H02K 5/10 277/630 |
| 9,068,481 | B2 | 6/2015 | Watanabe | |
| 2015/0208525 | A1* | 7/2015 | Negishi | H05K 5/0056 361/752 |
| 2019/0199176 | A1* | 6/2019 | Kanazawa | B62D 5/046 |
| 2021/0105917 | A1* | 4/2021 | Garcia Vila | H02J 7/0042 |
| 2022/0200415 | A1* | 6/2022 | An | H02K 5/18 |
| 2024/0244804 | A1* | 7/2024 | Horiba | H05K 7/20409 |

FOREIGN PATENT DOCUMENTS

| | | | |
|---|---|---|---|
| CN | 112865440 | A | 5/2021 |
| JP | 2001213384 | A | 8/2001 |

OTHER PUBLICATIONS

German Office Action, DE102024105294.5, dated Nov. 6, 2024 (w_translation).
Machine translation CN112865440.

* cited by examiner

*Primary Examiner* — Jacob R Crum
(74) *Attorney, Agent, or Firm* — Fishman Stewart PLLC

(57) ABSTRACT

A housing apparatus of electrical components may include a housing and a membrane. The housing may define at least a portion of a watertight housing chamber in which a plurality of electrical components are accommodated. The membrane may seal an opening of the housing. The opening may be in communication with the housing chamber. The opening may be positioned such that the plurality of electrical components are not exposed to water even if a predetermined amount of water entered the housing through the opening.

20 Claims, 3 Drawing Sheets

HOUSING APPARATUS OF ELECTRICAL COMPONENTS

CROSS-REFERENCE TO RELATED APPLICATION

This application claims priority to Japanese Patent Application No. JP 2023-043394, filed on Mar. 17, 2023, the contents of which is hereby incorporated by reference in its entirety.

TECHNICAL FIELD

The present invention relates to a housing apparatus of electrical components, and particularly relates to a housing apparatus of electrical components mounted on board a vehicle.

BACKGROUND

Electrical components must avoid contact with water. Therefore, for example, a motor-driven auxiliary unit provided with a waterproof seal in a resin cover, over the whole periphery of a joint face (seal line) between a left case and an area that covers mainly a motor has been proposed (refer, e.g., to Patent Literature 1).

CITATION LIST

Patent Literature

[Patent Literature 1] JP 2001-213384 A

In an environment where, e.g., the temperature changes, the air inside a housing chamber in which electrical components are accommodated also expands or contracts. However, it is not easy to seal a housing chamber so as to withstand such expansion or contraction of air inside the housing chamber over a long period. Therefore, in order to compensate for the expansion or contraction of air inside the housing chamber, there are cases where a membrane, through which air passes but water does not easily pass, is used.

However, it is considered that water which has become steam also enters the housing chamber through the membrane, and in such cases water should also be prevented from contacting electrical components. Furthermore, it is desirable to prevent water from contacting electrical components to the extent possible, even in the case where water has penetrated inside the housing chamber due to peeling of the membrane etc.

Thus, taking the aforementioned problem into consideration, the object of the present invention is to prevent water from contacting electrical components accommodated inside a housing chamber.

SUMMARY

In order to solve the aforementioned problem, the housing apparatus of electrical components according to the present invention is provided with a housing defining at least a portion of a watertight housing chamber in which electrical components are accommodated, and a membrane sealing an opening formed in the housing, where the opening is in communication with the housing chamber. The opening is positioned so that the electrical components are not exposed to water even if a predetermined amount of water enters into the housing through the opening.

According to this mode, even if a predetermined amount of water enters through an opening where a membrane is disposed, water can be prevented from contacting electrical components.

The housing defines at least a portion of a separate chamber in communication with the housing chamber, and the separate chamber may also be formed to be able to accommodate the predetermined amount of water and to avoid water from entering the housing chamber. The opening may also be disposed in the separate chamber. According to this mode, even if a predetermined amount of water enters into the housing, water can be prevented from entering the housing chamber. Therefore, water can be better prevented from contacting electrical components.

The electrical components may also be electrical components mounted on a vehicle. There are cases where a vehicle also drives in the rain, and hence it is highly necessary to avoid water from contacting electrical components. According to this mode, water can be prevented from contacting such electrical components mounted on a vehicle.

The electrical components may also be configured so as to control an actuator mounted on the vehicle. According to this mode, the impact on the control of the actuator due to water can be prevented.

The actuator may also be a motor for cooling. The motor for cooling is generally disposed inside the engine room of the front of the vehicle, where rain may fall in through a front grille etc. According to this mode, the impact on the control of such motor for cooling due to water can be prevented. The housing apparatus for electrical components may also be integrally configured with the actuator.

Advantageous Effects of Invention

According to the present invention, water can be prevented from contacting electrical components accommodated inside the housing chamber according to the present invention.

DETAILED DESCRIPTION

Figure 1:
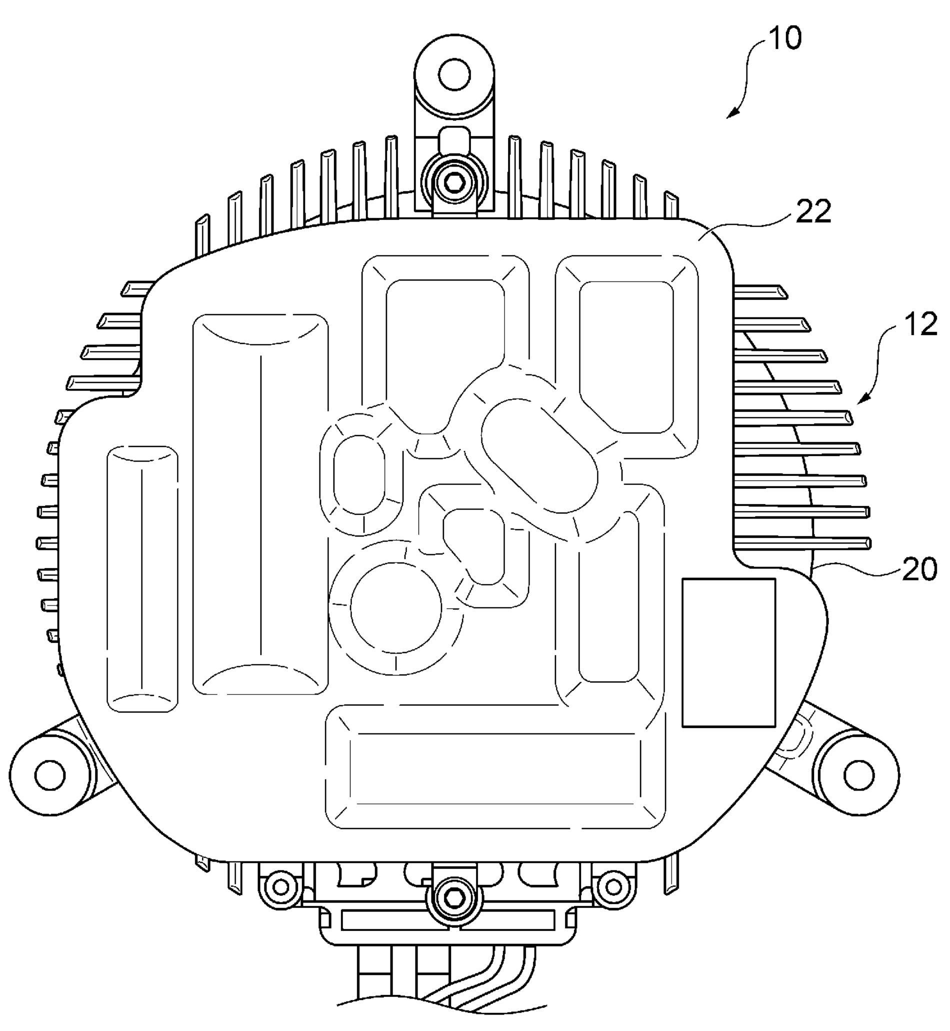
FIG. 1 is a front view of a motor assembly according to the present embodiment.
Figure 2:
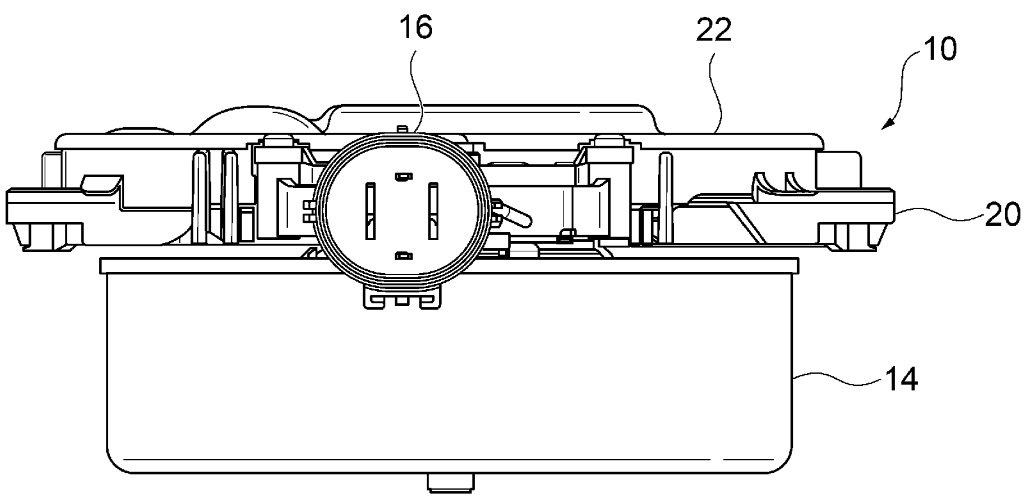
FIG. 2 is a side view of a motor assembly according to the present embodiment.

FIG. 1 is a front view of a motor assembly 10 according to the present embodiment. FIG. 2 is a side view of the motor assembly 10 according to the present embodiment. The motor assembly 10 has a housing apparatus 12 of a substrate, a motor 14 and a connector portion 16. In the present embodiment, the housing apparatus 12, the motor 14 and the connector portion 16 are integrally configured as one unit.

The motor assembly 10 according to the present embodiment is a motor for cooling which drives a fan for cooling a radiator inside the engine room of a vehicle. The motor assembly 10 is disposed inside the engine room of a vehicle so that the rotational axis of a motor 14 is substantially horizontal. The motor assembly 10 may also be a motor employed in another application.

Power is supplied through a connector portion 16 to a substrate and the motor 14 accommodated in the housing apparatus 12. The substrate is configured so as to control the motor 14.

Figure 3:
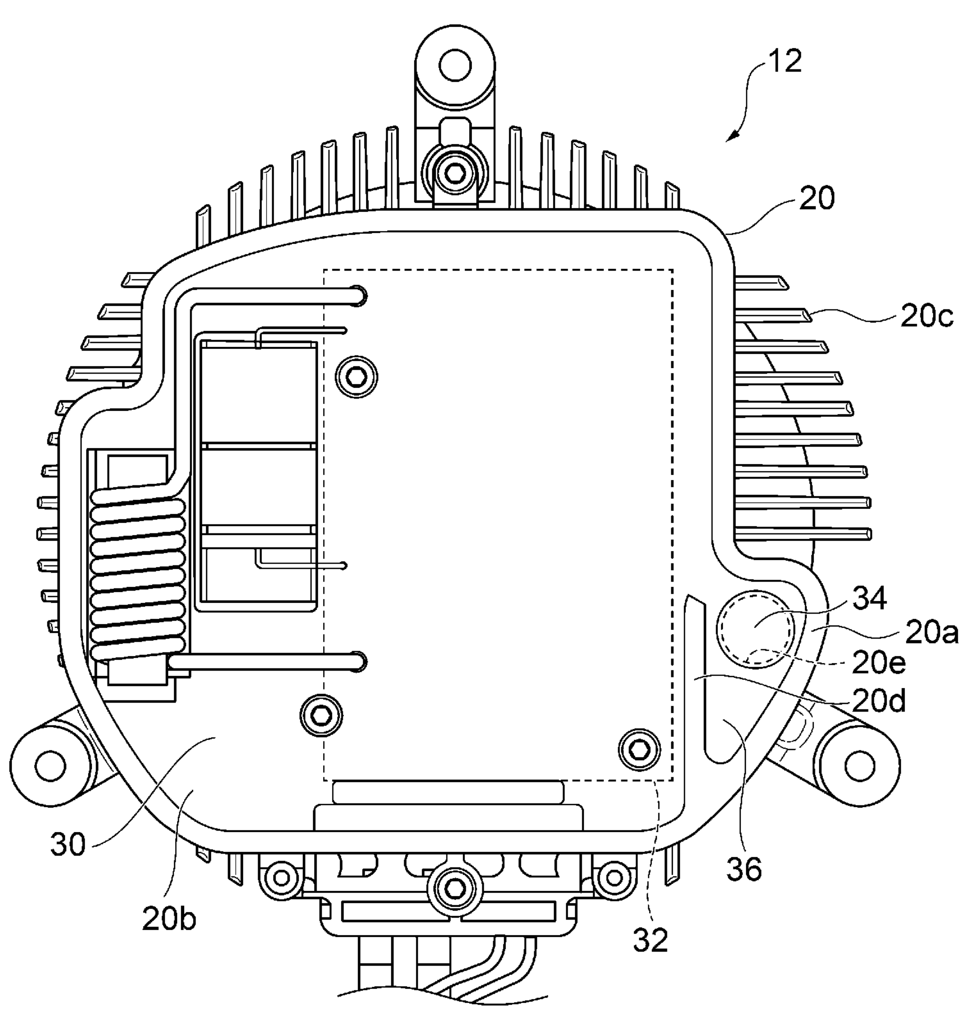
FIG. 3 is a front view of a housing apparatus according to the present embodiment.

FIG. 3 is a front view of the housing apparatus 12 according to the present embodiment. For ease of understanding, FIG. 3 shows a state in which a cover 22 was removed. A housing 20 has a substantially disk-shaped external shape, and has an outer edge portion 20*a*, a base portion 20*b* and fins 20*c*. The housing 20 is disposed inside a vehicle so as to be substantially circular shaped when viewed from the front of the vehicle. The base portion 20*b* is formed in a planar shape perpendicular to the rotational axis of the motor 14. The motor 14 is formed so that the outer edge portion 20*a* protrudes in the direction opposite to the side where the motor 14 is disposed, where the outer edge portion 20*a* has a substantially constant width from the outer periphery of the base portion 20*b*. The fins 20*c* are provided for cooling an electrical component such as a substrate 32. The fins 20*c* are formed so as to protrude from the outer periphery of the base portion 20*b*.

The cover 22 is mounted so as to abut the outer edge portion 20*a*. Thereby, a housing chamber 30 in which the substrate 32 is accommodated is formed by the outer edge portion 20*a* and the base portion 20*b* of the housing 20, and by the cover 22. Accordingly, the housing 20 defines a portion of the housing chamber 30. The substrate 32 accommodated in the housing chamber 30 controls the drive of the motor 14.

As mentioned above, the motor assembly 10 is disposed inside the engine room of a vehicle. There are cases where the vehicle drives in the rain, and rainwater having fallen into the engine room via the front grille etc. may adhere to the motor assembly 10. Moreover, water may also adhere to the motor assembly 10 when the vehicle drives through a deep water puddle. The housing chamber 30 in which the substrate 32 is accommodated must be configured to be watertight so that the drive of the motor 14 is not impacted due to water adhering to the motor assembly 10 as described above. Therefore, the outer edge portion 20*a* of the housing 20 and the cover 22 are fixed to be watertight via a shielding member such as a seal.

However, the temperature inside the engine room of a vehicle changes markedly, and in conjunction with this temperature change, air inside the housing chamber 30 markedly expands and contracts. In order to compensate for such expansion and contraction of air inside the housing chamber 30, the housing apparatus 12 has a membrane 34. An opening 20*e* is formed at the housing 20. The opening 20*e* is in communication with the housing chamber 30. The membrane 34 seals this opening 20*e*. The membrane 34 has a property in which air passes through but water does not easily pass through. Therefore, expansion and contraction of air inside the housing chamber 30 can be compensated by using this membrane 34.

However, it is considered that water which has become steam also enters the housing chamber 30 through the membrane 34 and in also such cases, water should be prevented from contacting the substrate 32. Furthermore, even in the case where water has penetrated inside the housing chamber 30 due to peeling of the membrane 34 etc., it is desirable to prevent water from contacting the substrate 32 to the extent possible.

Therefore, in the present embodiment, the opening 20*e* is positioned so that the substrate 32 is not exposed to water even if a predetermined amount of water enters into the housing 20 through the opening 20*e*. Specifically, the housing 20 further has a partition wall 20*d*. The partition wall 20*d* protrudes from the base portion 20*b* so as to extend upward from the downward part of the outer edge portion 20*a*.

The partition wall 20*d* abuts the inner surface of the cover 22 when the cover 22 is mounted to the housing 20. At this time, the partition wall 20*d* and the base portion 20*b*, together with the cover 22, define a separate chamber 36. The upper edge of the partition wall 20*d* has a gap with respect to the outer edge portion 20*a*. Therefore, the separate chamber 36 is in communication with the housing chamber 30 via this gap.

The separate chamber 36 can accommodate a predetermined amount of water up until the water reaches the upper edge of the partition wall 20*d*, while avoiding water from entering the housing chamber 30 by means of the partition wall 20*d*. The opening 20*e* is disposed in the separate chamber 36. Thereby, even if water entered the separate chamber 36, such water can be accommodated in the separate chamber 36 up until this predetermined amount, and hence water can be prevented from entering the housing chamber 30. Therefore, water can be better prevented from contacting the substrate 32.

The present invention has been explained by referring to the above embodiment. Meanwhile, the present invention is not limited to the aforementioned embodiment, but suitably combined or substituted configurations of the embodiments are also included in the present invention. Moreover, based on the knowledge of the person skilled in the art, a combination or order of processings may also be suitably rearranged in the embodiment, or a modification such as any kind of design change may also be added to the embodiment; and the embodiments to which such modifications were added may also be included in the scope of the invention.

In a certain modified example, the separate chamber 36 is not provided, and the opening 20*e*, which has the membrane 34 is mounted thereto, is formed in the housing chamber 30. At this time, the opening 20*e* is disposed more downward than the lowermost portion of the substrate 32. Even in this case, the opening 20*e* is positioned so that the substrate 32 is not exposed to water even if water enters the housing chamber 30 up until the water reaches a predetermined amount at the lowermost portion of the substrate 32. Even in this case, water can be prevented from contacting the substrate 32 even if a predetermined amount of water enters through the opening 20*e*.

The invention claimed is:

1. A housing apparatus of electrical components, comprising:

a housing defining at least a portion of i) a watertight housing chamber in which a plurality of electrical components are accommodated and ii) a separate chamber in communication with the housing chamber; and a membrane sealing an opening of the housing that opens into the separate chamber and is in communication with the housing chamber via the separate chamber;

wherein the opening is positioned such that, when an amount of water that has entered the housing via the opening is less than a predetermined amount, the water is accommodated in the separate chamber and restricted from entering the housing chamber preventing exposure of the plurality of electrical components to the water.

2. The housing apparatus of electrical components according to claim 1, wherein the separate chamber is formed in an interior of the housing to accommodate the predetermined amount of water, while avoiding entry of water into the housing chamber.

3. The housing apparatus of electrical components according to claim 2, wherein the plurality of electrical components are a plurality of electrical components mounted on a vehicle.

4. The housing apparatus of electrical components according to claim 3, wherein the plurality of electrical components are configured to control an actuator mounted on the vehicle.

5. The housing apparatus of electrical components according to claim 4, wherein the actuator is a motor for cooling.

6. The housing apparatus of electrical components according to claim 5, wherein the housing apparatus is structured integrally with the actuator.

7. A housing apparatus for electrical components, comprising:

a housing including a base portion, an outer edge portion projecting from the base portion, and an opening;

a cover disposed on the housing;

a housing chamber adapted to accommodate at least one electrical component, the housing chamber defined by the housing and the cover;

a membrane connected to the housing and sealing the opening; and a separate chamber adapted to accommodate water entering the housing via the opening;

wherein the opening is in fluid communication with the housing chamber and is positioned on the housing such that, when an amount of water that has entered the housing via the opening is less than a predetermined amount, the water is accommodated in the separate chamber and is restricted from entering the housing chamber.

8. The housing apparatus according to claim 7, wherein a volume of the separate chamber is equal to or greater than the predetermined amount of water.

9. The housing apparatus according to claim 7, wherein:

the opening is disposed in and defined by the base portion; and the opening opens into the separate chamber and is in fluid communication with the housing chamber via the separate chamber.

10. The housing apparatus according to claim 7, wherein:

the housing further includes a partition wall disposed between the housing chamber and the separate chamber; and the partition wall projects from the outer edge portion and extends from the base portion to the cover.

11. The housing apparatus according to claim 10, wherein:

a gap is defined between a free edge of the partition wall and the outer edge portion; and the housing chamber and the separate chamber are in fluid communication with one another via the gap.

12. The housing apparatus according to claim 10, wherein:

the cover is arranged on the outer edge portion of the housing;

the partition wall includes a first side and an opposite second side;

wherein the housing chamber is defined at least partially by the cover, the base portion, the outer edge portion, and the first side of the partition wall;

the separate chamber is defined at least partially by the cover, the base portion, the outer edge portion, and the second side of the partition wall.

13. The housing apparatus according to claim 11, wherein:

the partition wall projects from a lower region of the outer edge portion toward an upper region of the outer edge portion; and the lower region of the outer edge portion and the upper region of the outer edge portion are disposed opposite one another in a direction of gravity.

14. The housing apparatus according to claim 7, wherein the housing includes a plurality of cooling fins protruding from an outer periphery of the base portion.

15. The housing apparatus according to claim 7, wherein the membrane is permeable to air and is substantially impermeable to water.

16. The housing apparatus according to claim 7, wherein:

the housing and the cover are connected to one another in a watertight manner via a seal;

the opening is disposed in and defined by the base portion; and the outer edge portion extends around an outer perimeter of the base portion.

17. The housing apparatus according to claim 1, wherein the housing further includes a partition wall disposed between and at least partially separating the housing chamber and the separate chamber from one another.

18. The housing apparatus according to claim 17, wherein:

the housing further includes a base portion and an outer edge portion projecting from the base portion;

the partition wall projects from a lower region of the outer edge portion toward an upper region of the outer edge portion; and the lower region of the outer edge portion and the upper region of the outer edge portion are disposed opposite one another in a direction of gravity.

19. The housing apparatus according to claim 18, wherein:

a gap is defined between a free edge of the partition wall and the outer edge portion; and the housing chamber and the separate chamber are in fluid communication with one another via the gap.

20. A housing apparatus for electrical components, comprising:

a housing including a base portion, an outer edge portion projecting from the base portion, a partition wall, and an opening;

a cover disposed on the housing;

a housing chamber adapted to accommodate at least one electrical component, the housing chamber defined by the housing and the cover;

a separate chamber defined by the housing and the cover and adapted to accommodate water entering the housing via the opening, the separate chamber and the housing chamber at least partially separated from one another via the partition wall of the housing; and a membrane connected to the housing and sealing the opening;

wherein the opening opens into the separate chamber and is positioned on the housing such that, when an amount of water that has entered the housing via the opening is less than a volume of the separate chamber, the water is accommodated in the separate chamber and is restricted from entering the housing chamber via the partition wall.

* * * * *